US006842247B1

United States Patent
Wehrens et al.

(10) Patent No.: US 6,842,247 B1
(45) Date of Patent: Jan. 11, 2005

(54) RETICLE INDEPENDENT RETICLE STAGE CALIBRATION

(75) Inventors: Martijn Gerard Dominique Wehrens, Waalre (NL); Carlo Cornelis Maria Luijten, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/669,680

(22) Filed: Sep. 25, 2003

(51) Int. Cl.[7] .............................................. G01B 11/00
(52) U.S. Cl. .................................................... 356/400
(58) Field of Search ........................ 356/124, 399–401, 356/614, 624, 626, 627, 630, 237.1–237.2, 237.5, 239.1–239.3, 239.7; 355/53, 55, 67; 250/548, 559.27, 559.29, 559.3, 559.19, 559.21

(56) References Cited

U.S. PATENT DOCUMENTS

| | | | | |
|---|---|---|---|---|
| 6,002,487 A | * | 12/1999 | Shirata | 356/400 |
| 6,027,843 A | * | 2/2000 | Kojima et al. | 430/30 |
| 2004/0130689 A1 | * | 7/2004 | Starikov et al. | 355/53 |

* cited by examiner

Primary Examiner—Zandra V. Smith
Assistant Examiner—Gordon J. Stock, Jr.
(74) Attorney, Agent, or Firm—Pillsbury Winthrop LLP (57) ABSTRACT

A system, apparatus, and method for calibrating the reticle of a lithographic system is presented herein. The method includes imaging a reticle through a lithographic system, measuring a set of height offsets based on the imaged reticle and decomposing the set of measured height offsets in accordance with a plurality of distortional factors. The invention further comprises determining the reticle stage deformation attributes based on the distortional factors and the reticle deformation attributes, and then calibrating the reticle stage based on the stage deformation attributes.

19 Claims, 7 Drawing Sheets

Measure a set of these marks in the slit using TIS:

} lens
} slit

Iteration A:

| cycle 1 | cycle 2 | cycle 3 |
|---|---|---|
| RS y = 0 | RS y = 0 | RS y = 0 |
| TIS Y = +1/2 Y slit | TIS Y = 0 | TIS Y = -1/2 Y slit |
| RE y = RSy + TIS y | RE y = RSy + TIS y | RE y = RSy + TIS y |

Iteration B (move Reticle Stage RS)

| cycle 1 | cycle 2 | cycle 3 |
|---|---|---|
| RS y = + step | RS y = + step | RS y = +step |
| TIS Y = +1/2Y slit | TIS Y = 0 | TIS Y = -1/2Y slit |
| RE y = RSy + TISy | RE y = RSy + TISy | RE y = RSy + TISy |

This provides a set of Zmeas values at:

Z ( x = left, Yrs = 0, Ysl = +1/2slit)    Z ( x = left, Yrs = +step, Ysl = +1/2slit)

Z ( x = 0, Yrs = 0, Ysl = +1/2slit)       Z ( x = 0, Yrs = +step, Ysl = +1/2slit)

Z ( x = right, Yrs = 0, Ysl = +1/2slit)   Z ( x = right, Yrs = +step, Ysl = +1/2slit)

Scan Direction (Y)

actuating mechanisms

Uncalibrated RS

Calibrated RS
(shown for Z, $R_x$)

RETICLE INDEPENDENT RETICLE STAGE CALIBRATION

BACKGROUND OF THE INVENTION

1. Field of the Invention

The present invention generally relates to reticle stage calibration in lithographic apparatus.

2. Description of the Related Art

The term "patterning means" as will be employed herein should be broadly interpreted to refer to means that can be used to endow an incoming radiation beam with a patterned cross-section, corresponding to a pattern that is to be created in a target portion of the substrate. The term "light valve" may also be used in this context. Generally, the pattern will correspond to a particular functional layer in a device being created in the target portion, such as an integrated circuit or other device (see below). Examples of such patterning means include:

(a) a mask: the concept of a mask or reticle is well known in lithography, and it includes reticle types such as binary, alternating phase-shift, and attenuated phase-shift, as well as various hybrid reticle types. Placement of such a reticle in the radiation beam causes selective transmission (in the case of a transmissive mask) or reflection (in the case of a reflective mask) of the radiation impinging on the reticle, according to the pattern on the reticle. In the case of a reticle, the support structure will generally be a reticle table, which ensures that the reticle can be held at a desired position in the incoming radiation beam, and that it can be moved relative to the beam if so desired;

(b) a programmable mirror array: an example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required; and (c) a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a reticle and reticle table; however, the general principles discussed in such instances should be seen in the broader context of the patterning means as set forth above. Also, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Lithographic exposure apparatuses can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time.

In current apparatuses, employing patterning by a reticle on a reticle table, a distinction can be made between two different types of machine. In one type of lithographic exposure apparatus, each target portion is irradiated by exposing the entire reticle pattern onto the target portion in one go; such an apparatus is commonly referred to as a wafer stepper. In an alternative apparatus —commonly referred to as a step-and-scan apparatus—each target portion is irradiated by progressively scanning the reticle pattern under the projection beam in a given reference direction (the "scanning" direction) while synchronously scanning the substrate table parallel or anti-parallel to this direction. Because, in general, the projection system will have a magnification factor M (generally <1), the speed V at which the substrate table is scanned will be a factor M times that at which the reticle table is scanned. More information with regard to lithographic devices as here described can be gleaned, for example, from U.S. Pat. No. 6,046,792, incorporated herein by reference.

It is to be noted that the lithographic apparatus may also be of a type having two or more substrate tables (and/or two or more reticle tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Figure 1A:
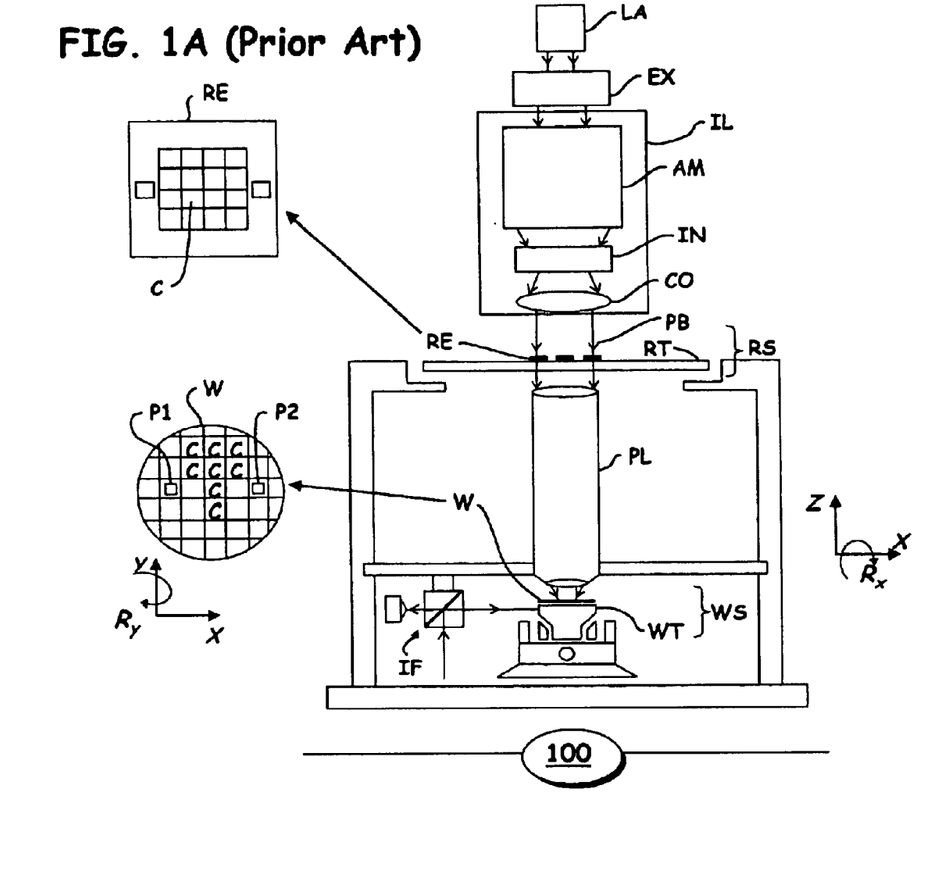
FIG. 1A is a schematic illustration of a lithographic system in accordance with the present invention.

Among other things, lithographic systems are used in the manufacture of integrated circuits (ICs). As schematically depicted in FIG. 1A, such systems commonly employ a lithographic exposure apparatus 100 to project or expose a circuit pattern residing on a reticle RE onto a target field C on a layer of silicon wafer substrate W via an irradiating projection beam PB. The projection beam PB may encompass different types of electromagnetic radiation including, but not limited to, ultraviolet radiation (UV) and extreme ultra-violet radiation (EUV), as well as particle beams, such as ion beams or electron beams.

In particular, lithographic apparatus 100 includes radiation source LA and radiation system IL for providing projection beam PB, a first object table (e.g. reticle table) RT provided with a reticle holder for holding a reticle RE, and a projection system PL (e.g., lens) for imaging an irradiated portion of the reticle RE onto a target portion C (e.g. comprising one or more dies) of the substrate W. The combination of the reticle RE, reticle table RT, and reticle-related components are commonly referred to as the reticle stage RS. As depicted, lithographic apparatus 100 is of a transmissive type (i.e. has a transmissive mask). However, in general, it may also be of a reflective type (with a reflective mask) and, alternatively, apparatus 100 may employ another kind of patterning means, such as a programmable mirror array of a type as indicated above.

Lithographic apparatus 100 further comprises a second object table (e.g., wafer substrate table) WT provided with a substrate holder for holding a wafer substrate W (e.g. a resist-coated silicon wafer). The combination of the wafer substrate W, wafer table WT, and wafer-related components are commonly referred to as the wafer substrate stage WS.

Source LA produces a beam of radiation, which is fed into illumination system (e.g., illuminator) IL, either directly or after having traversed conditioning means, such as a beam expander EX, for example. Illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the reticle RE has a desired cross-sectional uniformity and intensity distribution.

Projection beam PB subsequently intercepts the reticle RE, which is held on a reticle table RT. The reticle table RT and/or the reticle stage RS may contain an actuating mechanism for adjusting the position of the reticle table RT, including height, tilt, rotational, and level positions. Having traversed the reticle RE, the beam PB passes through the lens PL, which focuses the beam PB onto a target portion C of the wafer substrate W. With the aid of the second positioning means (and interferometric measuring means IF), the substrate table WT can be moved accurately (e.g. so as to position different target portions C in the path of the beam PB). Similarly, the first positioning means can be used to accurately position the reticle RE with respect to the path of the beam PB (e.g. after mechanical retrieval of the reticle RE from a reticle library, or during a scan).

In general, movement of the object tables RT, WT will be realized with the aid of a long-stroke module (course positioning) and a short-stroke module (fine positioning), which are not explicitly depicted in FIG. 1A. However, in the case of a wafer stepper (as opposed to a step-and-scan apparatus), the reticle table RT may just be connected to a short stroke actuator, or may be fixed.

Lithographic apparatus 100 may operate in two different modes:

(a) step mode: reticle table RT is kept essentially stationary, and an entire reticle image is projected in one go (i.e. a single "flash") onto a target portion C. The substrate table WT is then shifted in the x and/or y directions so that a different target portion C can be irradiated by the beam PB; and (b) scan mode: essentially the same scenario applies, except that a given target portion C is not exposed in a single "flash". Instead, reticle table RT is movable in a given direction (the so-called "scan direction", e.g. the y direction) with a speed v, so that projection beam PB is caused to scan over a reticle image. Concurrently, substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 1B:
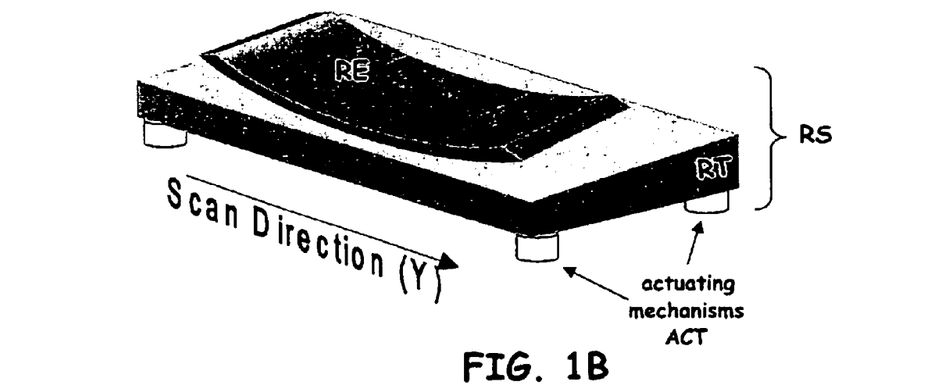
FIG. 1B is an illustration of reticle stage unflatness.

Regardless of the mode employed, the imaging quality of lithographic exposure apparatus 100 is contingent on the accuracy with which the reticle image is focused on wafer substrate W. An important factor influencing the accuracy of focused image is the deviation of the reticle stage RS from perfect flatness. FIG. 1B provides an example of reticle stage RS unflatness (RSU). Because the height and/or tilt deviations due to reticle stage RS unflatness locally change the effective angle of incidence of the illumination beam on the reticle RE, the XY position of the image features on the wafer W also change, thereby introducing deformities in, and compromising the accuracy of, the resultant image.

To complicate matters further, as indicated in FIG. 1B, the reticle RE is also subject to such deformations. In an effort to mitigate distortions due to reticle stage RS deformations, various methods have been developed to calibrate the reticle stage RS. Such methods involve calibrating the reticle stage RS, which also includes the effects of the reticle RE deformations.

SUMMARY OF THE INVENTION

Systems, apparatuses and methods consistent with the principles of the present invention, as embodied and broadly described herein, provide for reticle stage calibration independent of the reticle. In one embodiment, the present invention sets forth the concept of imaging a reticle through a lithographic system, measuring a set of height offsets based on the imaged reticle, and decomposing the set of measured height offsets in accordance with a plurality of distortional factors. The invention further comprises determining the reticle deformation attributes based on the distortional factors, determining the reticle stage deformation attributes based on the distortional factors and the reticle deformation attributes, and then calibrating the reticle stage based on the reticle stage deformation attributes.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc.

BRIEF DESCRIPTION OF THE DRAWINGS

Embodiments of the invention will now be described, by way of example only, with reference to the accompanying schematic drawings in which.

In the figures, corresponding reference symbols indicate corresponding parts.

DETAILED DESCRIPTION

As noted above, various methods have been developed to calibrate the reticle stage RS and mitigate the effects of reticle stage unflatness on the focal image. These methods necessarily calibrate the combined effect of both the reticle RE and reticle stage RS deformations, so that the calibration necessarily depends, in part, on the reticle RE topology. Such calibrations, therefore, cannot correct for the actual deformations of the reticle stage RS as these deformations are lumped with the reticle RE deformations, which obscures the true unflatness of the reticle stage RS.

As described in greater detail below, however, the present invention contemplates reticle stage calibration that is independent of the reticle. Such a process exploits exposure information to determine reticle-specific deformations. These reticle-specific deformations are then factored out to yield the desired reticle stage deformations. The reticle stage RS may then be calibrated independently of the reticle RE.

Figure 2A:
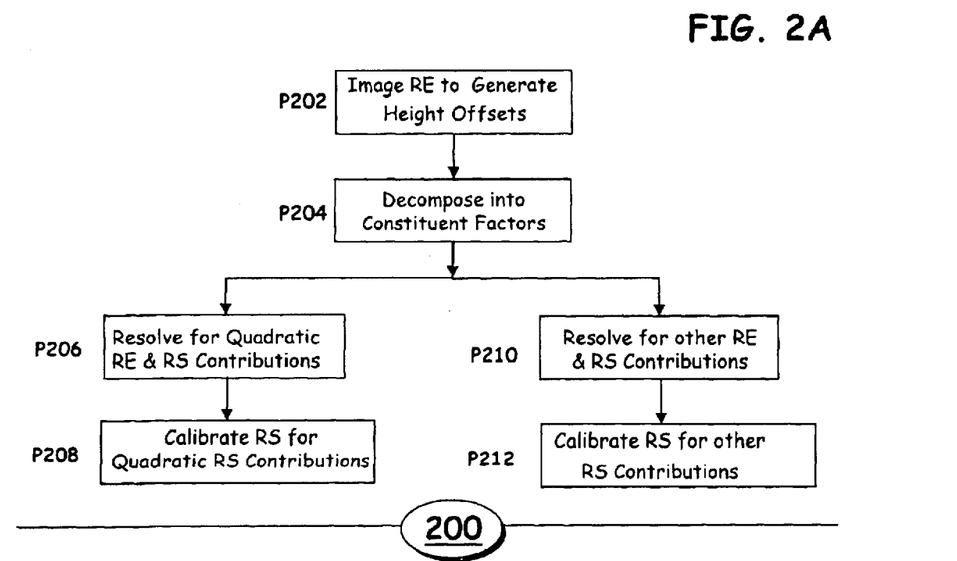
FIG. 2A is a functional flow diagram depicting an embodiment of the present invention.

FIG. 2A schematically depicts the general inventive concept of reticle stage calibration process 200, constructed and operative in accordance with a particular embodiment of the present invention. Process 200 may be executed by a processing mechanism PROC in connection with the lithographic system, as indicated by FIG. 2E. As discussed in greater detail below, processing mechanism PROC may be configured to decompose height offsets determine reticle RE deformation attributes, and determine reticle stage RS deformation attributes. As indicated in FIG. 2A, process 200 commences with procedure task P202, which images reticle RE to generate a set of reticle height offsets. That is, a projection beam PB of radiation is passed through the reticle RE to generate an image of the pattern on the reticle RE. In one embodiment, the exposure may be performed to generate a "floating z-map" of height offsets. In general, a z-map provides a collection of reticle height offsets, which indicate the changes in the z direction due to the various components encountered between the reticle RE and wafer substrate W. As such, these offsets collectively represent focal distortions attributable to the various components, including reticle RE and reticle stage RS distortions.

Generally, a reticle z-map is acquired by using one or more transmission image sensors (TIS) having detectors physically connected to a reference surface. Transmission image sensors TISs are configured to determine the vertical focus position of the projected image from the reticle RE under the projection lens PL. Typically, transmission image sensors TISs comprise apertures having photo-sensitive detectors mounted on a fiducial plate mounted to the top surface of the substrate table WT outside the area covered by the wafer W. The fiducial plate is made of a highly stable material with a very low coefficient of thermal expansion (e.g. Invar) and has a flat reflective upper surface which may carry markers used in alignment processes.

Figure 2B:
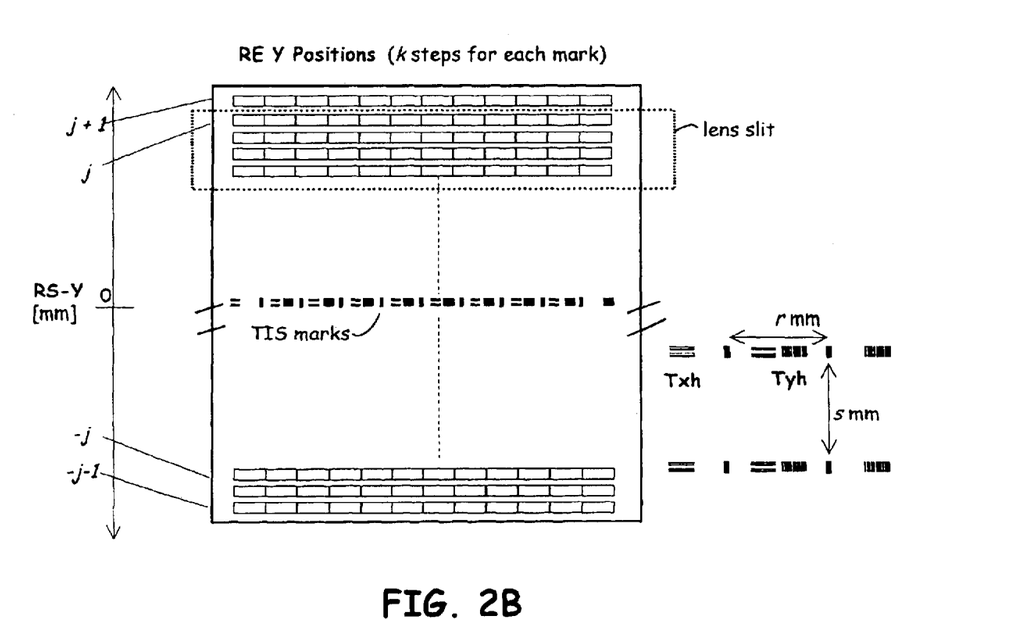
FIG. 2B illustrates a map in accordance with the present invention.

To determine the position of the focal plane, projection lens PL projects into space an image of a TIS pattern provided on the reticle RE, having contrasting light and dark regions, as depicted in FIG. 2B. As shown in FIG. 2B, the TIS pattern may be provided along rows (j+1) to (−j−1) of the reticle RE having constituent marks Txh, Tyh. The layout of the TIS patterns may be characterized by the periodicity of the marks which corresponds to the distance of the marks along the x-direction as r mm and along the y-direction s mm. The wafer stage WS is then scanned horizontally and vertically so that the aperture TIS passes through the space where the aerial image is expected to be. As the TIS aperture passes through the light and dark portions of the image of the TIS pattern, the output of the photo-sensitive detectors will fluctuate. The vertical level at which the rate of change of amplitude of the photodetector output is highest indicates the level at which the image of TIS pattern has the greatest contrast and hence indicates the plane of optimum focus. An example of a TIS of this type is described in greater detail in U.S. Pat. No. 4,540,277. Instead of the TIS, a Reflection Image Sensor (RIS) such as that described in U.S. Pat. No. 5,144,363 may also be used.

Figure 2C:
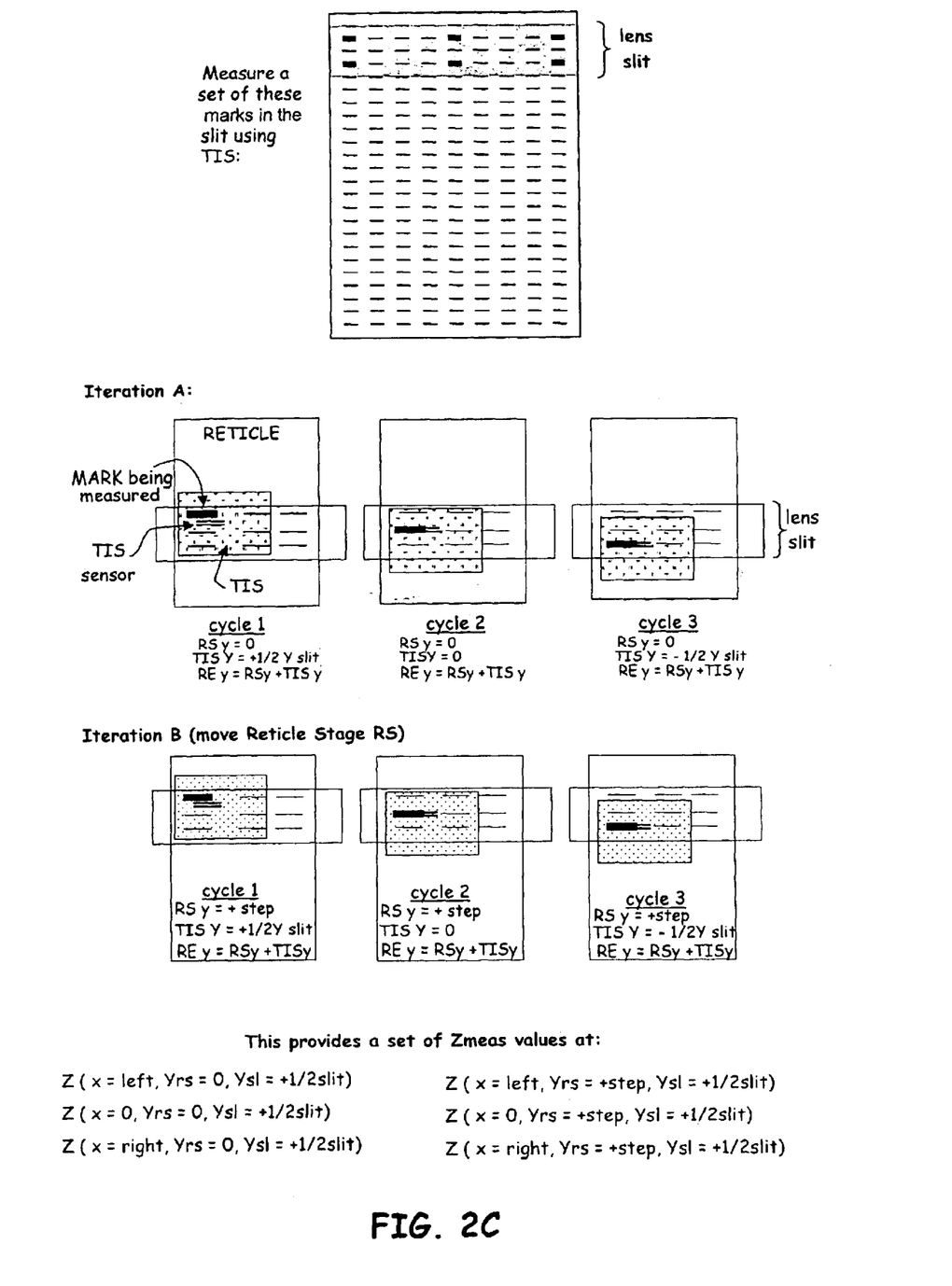
FIGS. 2C, 2D respectively illustrate exposure techniques in accordance with an embodiment of the present invention.

The reticle RE in the measurement scanning process described above, moves in the scan direction (e.g., along the y direction). Consistent with the principles of the present invention, however, a "floating z-map" is obtained by maintaining reticle RE fixed and allowing the transmission image sensors TIS to float in order to provide a map of height offsets for a floating TIS. That is, as illustrated in FIG. 2C, for a given iteration (e.g., iteration A), reticle RE is kept constant at a position $y_{rs}$ while the TIS scanning measurements are performed as the TIS mark is shifted or "floated" to a number predetermined positions. After the TIS measurement scanning cycles through the pre-determined TIS positions, the reticle RE may be positioned and held constant at another position $Y_{rs+1}$ (e.g., iteration B) and the floating TIS scanning measurements are then cycled through again.

This sequence may be iterated several times to produce a collection of height offsets for a floating TIS. As will be discussed in greater detail below, this collection of offsets provides sets of measurement points based on the reticle RE position as well as sets of measurement points for the reticle stage RS position. Because the TIS is allowed to float while the reticle RE position is fixed, the reticle RE points and the reticle stage RS points will not always match, thereby enabling a tractable method of identifying various deformation contributions.

Figure 2D:
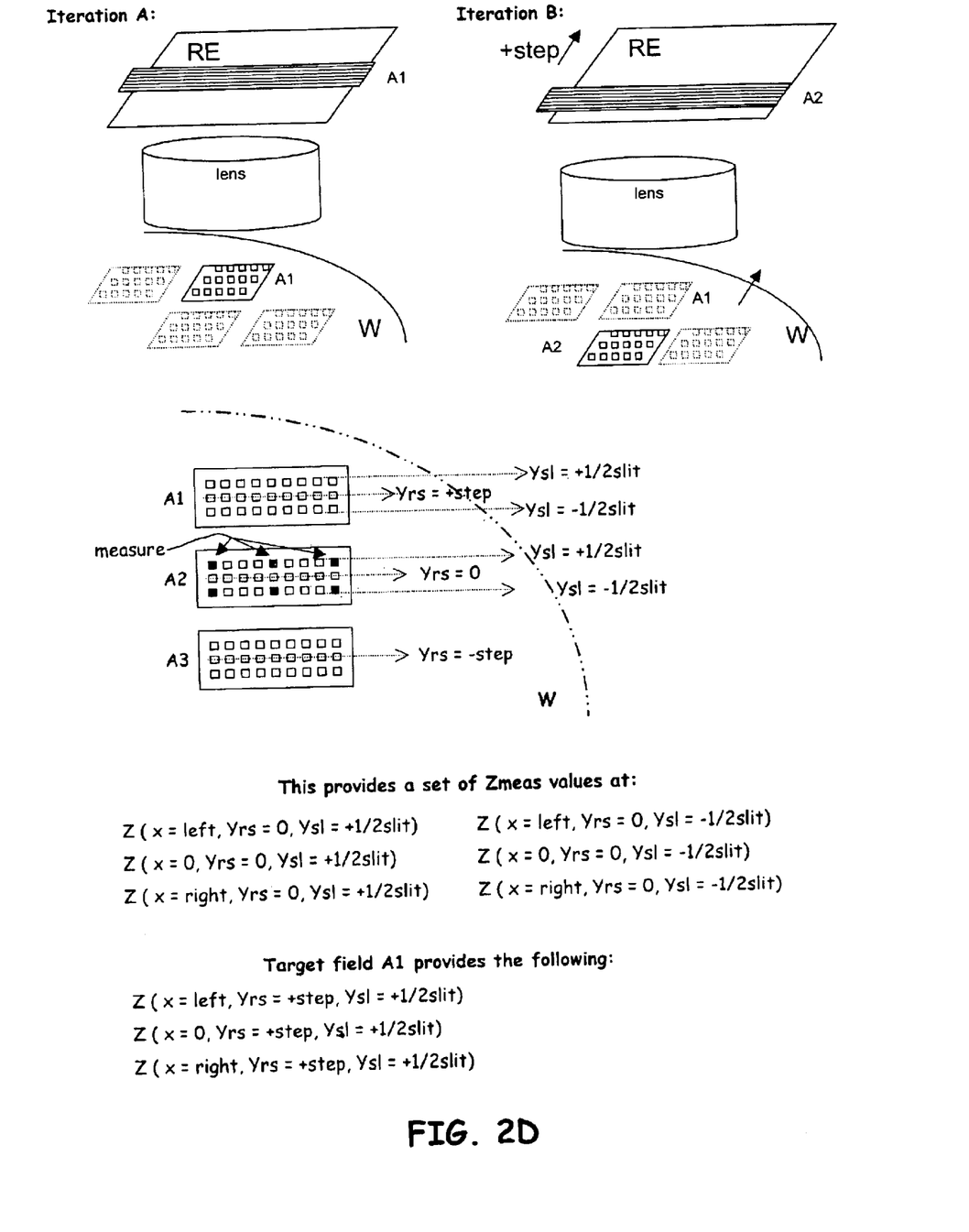
Figure 2E:
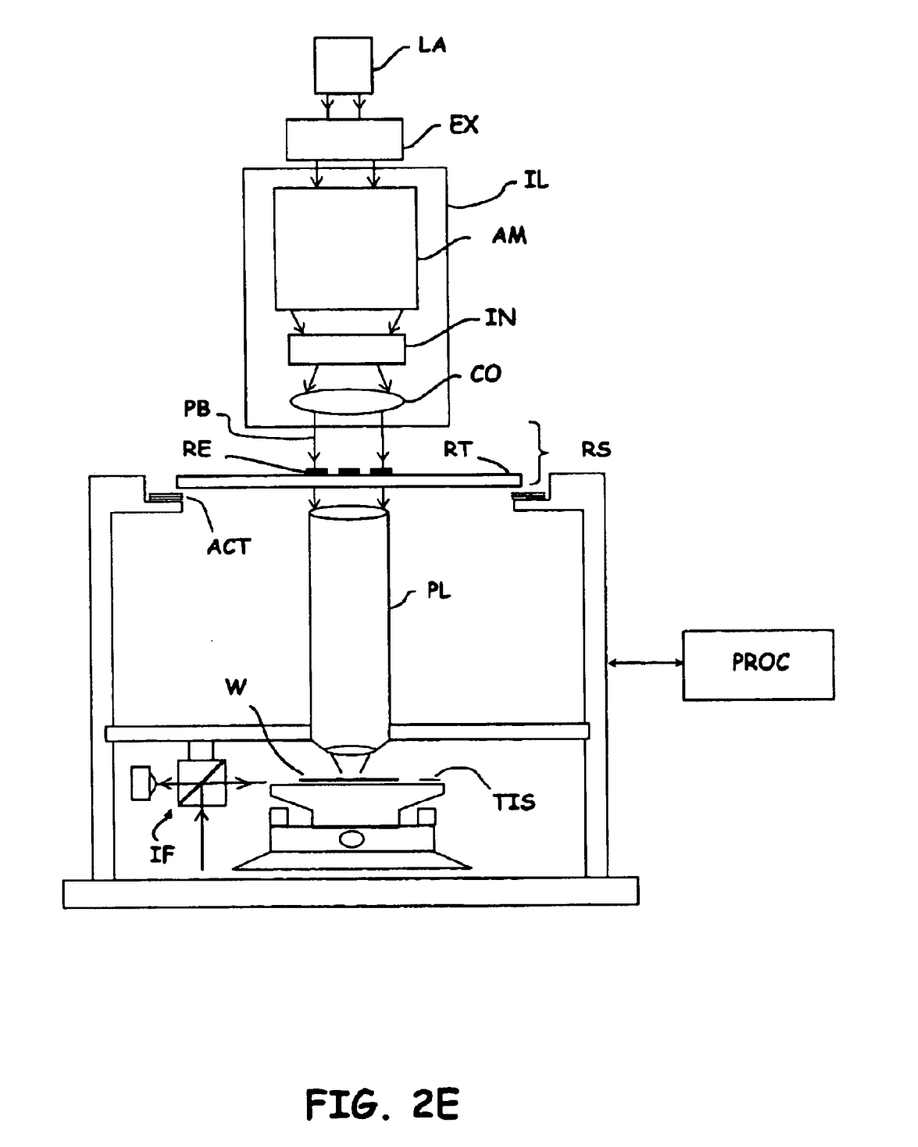
FIG. 2E illustrates features of a system in accordance with an embodiment of the present invention.

In an alternative embodiment, the exposure may be performed to generate a "static z-map" of height offsets. A "static z-map" produces reticle height offsets based on a series of static exposures of the reticle RE on target fields C of the wafer substrate W may be used create a z-map. That is, as indicated in FIG. 2D, the reticle RE is equipped with alignment marks A1–A3 which, when exposed onto target fields C of the wafer substrate W, provides the ability to measure the focus on the wafer substrate W. The set of alignment marks A1–A3 are statically exposed through the slit onto the wafer substrate W for multiple reticle stage RS positions. The exposed alignment marks A1–A3 reflect focusing information, which is then measured to produce a "static z-map" of height offsets.

Returning to FIG. 2A, upon acquiring the floating z-map data, process 200 progresses to procedure task P204, where the measured z-offsets, $Z_{meas}(x, y_{rs})$ are decomposes into its constituent factors. As indicated above, the z-map data indicates the changes in the z direction attributable to the various components between the reticle RE and wafer substrate W. These z-offsets exhibit several notable characteristics, which may expresses as:

$$Z_{meas}(x, y_{rs}) = z_0 + W \cdot y_{rs} + Ry \cdot x + C \cdot x \cdot y_{rs} + Q \cdot y_{rs}^2 \quad (1),\text{ where}$$

$z_0$: the height offset;

W: the linear wedge distortion due to the reticle and reticle stage;

Ry: the tilt offset in the scanning slit (i.e., left to right defocus) due to the reticle, reticle-stage, and TIS sensor;

C: the "corkscrew" or linear roll effect (ie., Ry-linear wedge) due to the reticle and reticle-stage;

x: the x-position of the reticle and in the slit;

$y_{rs}$: the y-position of the reticle stage;

Q: the quadratic wedge distortion due to the reticle and reticle stage.

It is to be noted that the quadratic wedge distortion due to the reticle RE and reticle stage RS, Q, as the greatest effect on reticle RE and reticle stage RS unflatness and, therefore, has the greatest distortional effect. Moreover, as a preliminary matter, it will be appreciated that the measured z-offset, $Z_{meas}(x, y_{rs})$ is affected by the position of TIS within the slit. As such, equation (I) may be expressed as:

$$Z_{meas}(x, y_{rs}, y_{sl}, y_r) = z_{0sl} + W_{sl} \cdot y_{sl} + Ry_{sl} \cdot x + Q_{sl} \cdot y_{sl}^2 + \quad (2)$$
$$C_{sl} \cdot x \cdot y_{sl} + z_{0rs} + W_{rs} \cdot y_{rs} + Ry_{rs} \cdot x +$$
$$Q_{rs} \cdot y_{rs}^2 + C_{rs} \cdot x \cdot y_{rs} + z_{0r} + W_r \cdot y_r +$$
$$Ry_r \cdot x + Q_r \cdot y_r^2 + C_r \cdot x \cdot y_r,$$

where $Z_{meas}(x, y_{rs}, y_{sl}, y_r)$: the height of TIS with reticle stage at position $y_{rs}$ and in slit pos x, $y_{sl}$.

$y_{rs}$: the position of the reticle stage in y;

$x, y_{sl}$: the position of TIS sensor in x,y;

$y_r$: the position on the reticle in y ($y_r = y_{rs} + Y_{sl}$);

$z_{0sl}$: the height offset of TIS; $z_{0rs}$: the height offset of the reticle; and; $z_{0rs}$: the height offset of the reticle stage;

$Ry_{sl}$: the slit tilt in x of TIS;

$Ry_r$: the tilt offset of the reticle ('Ry$_0$');

$Ry_{rs}$: the tilt offset of the reticle and reticle stage ('Ry$_0$');

$W_{sl}$: the wedge distortion in the slit, i.e. $Rx_{sl}$;

$W_r$: the wedge distortion of the reticle;

$W_{rs}$: the wedge distortion of the reticle stage;

$Q_{sl}$: the quadratic contribution of the slit (i.e. $FC_{lens} + FC_{yTIs}$)

$Q_r$: the quadratic wedge distortion of the reticle;

$Q_{rs}$: the quadratic wedge distortion of the reticle stage;

$C_{sl}$: the corkscrew distortion of the slit, i.e. TIS deformation;

$C_r$: the corkscrew distortion of the reticle; and $C_{rs}$: the corkscrew distortion of the reticle stage.

Making the reasonable assumption that the y position of the reticle RE is the position of the slit and the reticle stage RS, i.e., $y_r = Y_{sl} + y_{rs}$, equation (2) may be rewritten and expressed as:

$$Z_{meas}(x, y_{rs}, y_{sl}) = z_0 + (Ry_{sl} + Ry_{rs} + Ry_r) \cdot x + \quad (3)$$
$$(W_{sl} + W_r) y_{sl} + (W_{rs} + W_r) y_{rs} +$$
$$(C_{sl} + C_r) x \cdot y_{sl} + (C_{rs} + C_r) x \cdot y_{rs} +$$
$$(Q_{sl} + Q_r) \cdot y_{sl}^2 + (Q_{rs} + Q_r) \cdot y_{rs}^2 +$$
$$Q_r \cdot 2 \cdot y_{rs} \cdot y_{sl}.$$

As noted above, the measured z-offset $Z_{meas}(x, y_{rs}, y_{sl})$ reflects a combination of factors indicative of the distortions due to the components between the reticle RE and the wafer substrate W. Such factors include the height of TIS and reticle RE, the Rx and Ry tilt of the reticle stage RS. As such, the measured z-offset $Z_{meas}(x, y_{rs}, y_{sl})$ may be expressed in terms of these factors as:

$$Z_{meas}(x, y_{sl}, y_{rs}) = Z_{sl}(x, y_{sl}) + Z_r(x, y_r) + Z_{rs}(y_{rs}) + y_{sl} \cdot Rx_{rs}(y_{rs}) + x \cdot Ry_{rs}(y_{rs}) \quad (4),\text{ where}$$

$Z_{meas}(x, y_{sl}, y_{rs})$: the height for TIS with reticle stage at position $y_{rs}$ and in slit pos x, $y_{sl}$;

$Z_{sl}(x, y_{sl})$: the height due to TIS at x,y;

$Z_r(x, y_r)$: the height due to reticle at x,y;

$Z_{rs}(y_{rs})$: the height due to reticle stage at position $y_{rs}$;

$Rx_{rs}(y_{rs})$: the front-to-back Rx tilt for reticle stage at position $y_{rs}$;

$Ry_{rs}(y_{rs})$: the left-to-right Ry tilt for reticle stage at position $y_{rs}$;

$y_{rs}$: the position of reticle stage in y; and $x, y_{sl}$: the position of TIS detector in x, y.

The contribution of the height of TIS factor, $Z_{sl}(x, y_{sl})$ may be approximated as:

$$Z_{sl}(x, y_{sl}) = Rx_{sl} \cdot y_{sl} + Ry_{sl} \cdot x + C_{sl} \cdot x \cdot y_{sl} + \quad (5)$$
$$FC_{lens} \cdot (x^2 + y_{sl}^2) + FC_{xTIS} \cdot x^2 + FC_{yTIS} \cdot y_{sl}^2,$$

where $Z_{sl}(x, y_{sl})$: the measured height with TIS (average);

x: the x position;

$y_{sl}$: the slit y position;

$Rx_{sl}$: the image tilt Rx;

$Ry_{sl}$: the image tilt Ry;

$C_{sl}$: the corkscrew-like distortion of the TIS plate due to unflatness and leveling;

$FC_{lens}$: the field curvature distortion of the lens; and $FC_{xTIS}$: the 2nd order warp distortion of the TIS plate in x; and $FC_{yTIS}$: the 2nd order warp distortion of the TIS plate in y.

The contribution of the height due to reticle RE at x,y, $Z_r(x, y_r)$, may be expressed as:

$$z_r(x, y_r) = z_0 + W_r \cdot y_r + Ry_r \cdot x + C_r \cdot x \cdot y_r + Q_r \cdot y_r^2 \quad (6), \text{ where}$$

$Z_r(x,y)$: the height at position $y_r$ and x;

$y_r$: the position of the reticle in y;

x: the position of reticle in x;

$z_0$: the height offset;

$W_r$: the linear wedge distortion due to reticle deformation;

$Ry_r$: the tilt offset of the reticle;

$Q_r$: the quadratic wedge distortion due to reticle deformation;

$C_r$: the corkscrew distortion (Ry-linear wedge) due to reticle deformation.

The contribution of the height due to reticle stage RS at position $Y_{rs}$, $Z_{rs}(y_{rs})$, may be approximated as:

$$Z_{rs}(Y_{rs}) = z_0 + W_{rs} \cdot Y_{rs} + Q_{rs} \cdot Y_{rs}^2 \quad (7), \text{ where}$$

$Z_{rs}(Y_{rs})$: the height for reticle stage at position $y_{rs}$;

$Y_{rs}$: the position of reticle stage (in y);

$z_0$: the height offset (reticle stage machine constant);

$W_{rs}$: the linear wedge distortion to reticle stage chuck wedge; and $Q_{rs}$: the quadratic wedge distortion due to reticle stage chuck wedge.

The contribution of the Rx front-to-back tilt for reticle stage at position $y_{rs}$, $Rx_{rs}(Y_{rs})$ may be approximated as:

$$Rx_{rs}(y_{rs}) = rx_0 + W_{rs} + Q_{rs} \cdot 2Y_{rs} \quad (8), \text{ where}$$

$rx_0$: the tilt offset Rx;

$W_{rs}$: the linear wedge distortion due to reticle stage chuck wedge;

$Q_{rs}$: the quadratic wedge distortion due to reticle stage chuck wedge; and $Y_{rs}$: the position of reticle stage (in y).

In an effort to minimize dynamic disturbances related to tilt actuation, the quadratic wedge distortion due to reticle stage chuck wedge, $Q_{rs}$, is disregarded for $R_x$ actuation in practice. As such, equation (8) may be approximated as:

$$Rx_{rs}(y_{rs})=rx_0+W_{rs} \quad (8a)$$

The contribution of the Ry left-to-right tilt for reticle stage at position $y_{rs}$, ($y_{rs}$), may be expressed as:

$$Ry_{rs}(y_{rs})=ry_0+C_{rs}\cdot y_{rs} \quad (9), \text{where}$$

$ry_0$: the tilt offset Ry;

$C_{rs}$: the corkscrew distortion; and $y_{rs}$: the position of reticle stage (in y).

Substituting equations (6), (7), (8a), and (9) into equation (5), the measured z-offset $Z_{meas}(x,y_{sl},y_{rs})$ of equation (4) may be manipulated and expressed in terms of its constituent factors, as follows:

$$\begin{aligned}Z_{meas}(x, y_{sl}, y_{rs}) = & z_0 + (FC_{lens} + FC_{xTIS})x^2 + \\ & (Ry_{sl} + ry_0 + Ry_r)x + \\ & (Rx_{sl} + rx_0 + W_r + W_{rs})y_{sl} + \\ & (W_r + W_{rs})y_{rs} + (C_{sl} + C_r)x \cdot y_{sl} + \\ & (C_{rs} + C_r)x \cdot y_{rs} + (Q_r + Q_{rs})y_{rs}^2 + \\ & Q_r 2 \cdot y_{sl} \cdot y_{rs} + (FC_{lens} + FC_{yTIS} + Q_r)y_{sl}^2\end{aligned} \quad (10)$$

Equation (10) contains two terms of particular interest: $(Q_r+Q_{rs})y_{rs}^2$ and $Q_r 2\cdot y_{sl}\cdot Y_{rs}$. As noted above, coefficient $Q_r$ represents the quadratic wedge distortion of the reticle RE and coefficient $Q_{rs}$ represents the quadratic wedge distortion of the reticle stage RS. Thus, by identifying $Q_r$, quadratic wedge distortion may be resolved in terms of the reticle stage RS only.

Upon decomposing the measured z-offset $Z_{meas}(x,y_{sl},y_{rs})$ into its constituent factors, process 200 advances to procedure task P206 to resolve for the quadratic reticle RE contributions. This is achieved by applying the height offsets to equation (10) and then solving for the quadratic wedge distortion coefficient of the reticle RE, $Q_r$. This is possible because keeping the reticle RE position constant $y_{rs}$ during the floating TIS measurement scanning sequence, enables the determination of the relationship between positions $y_{sl}$ and $y_{rs}$, such that a change in $y_{sl}$ provides a commensurate change in $y_{rs}$. This means that the TIS will "follow" the reticle stage RS movement in the slit.

In other words, one TIS mark on the reticle RE would be measured at a set $Y_{sl}$ and $Y_{rs}$ because the TIS and the reticle stage RS move together. Because this is done for the TIS marks on the reticle RE, the floating TIS offsets equate to a map of the TIS and reticle stage RS offsets (i.e., TIS+RS map offsets). The TIS contributions remain constant from reticle TIS mark to reticle TIS mark, so that the only difference would be the contributions of the reticle stage RS and the reticle RE (i.e., RS+RE map offsets). Because the TIS+RS map offsets or the RS+RE map offsets can be measured separately, it is possible to filter any of the three parts from the measured TIS height (TIS+lens, RS, or RE).

In an alternative embodiment employing the "static z-map" discussed above, because the set of alignment marks A1–A3 are statically exposed for multiple reticle stage RS positions, reticle-specific attributes, such as focusing information, are reflected by the different exposures on the wafer substrate W. This information may then be measured and correlated with the reticle RE.

After applying the measured values for each of the multiple positions, a suitable minimization scheme, such as, the least square method is applied. Because equation (10) quantifies the quadratic wedge distortion of the reticle RE as the term $(Q_r 2\cdot y_{sl}\cdot y_{rs})$ in which coefficient $Q_r$ is by itself, the reticle RE quadratic wedge distortion can be determined. And, upon determining $Q_r$, the term $(Q_r+Q_{rs})y_{rs}^2$, which quantifies the combined quadratic wedge distortion of reticle RE and reticle stage RS, is then solved for $Q_{rs}$. As such, the reticle stage RS quadratic wedge distortion $Q_{rs}$ is determined.

Figure 3A:
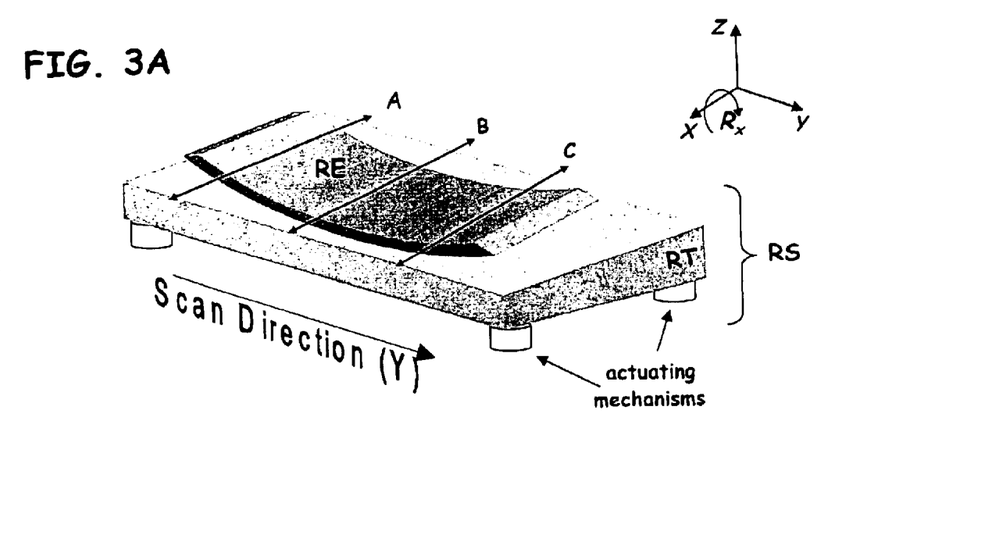
FIGS. 3A, 3B illustrate a calibration technique in accordance with an embodiment of the present invention.
Figure 3B:
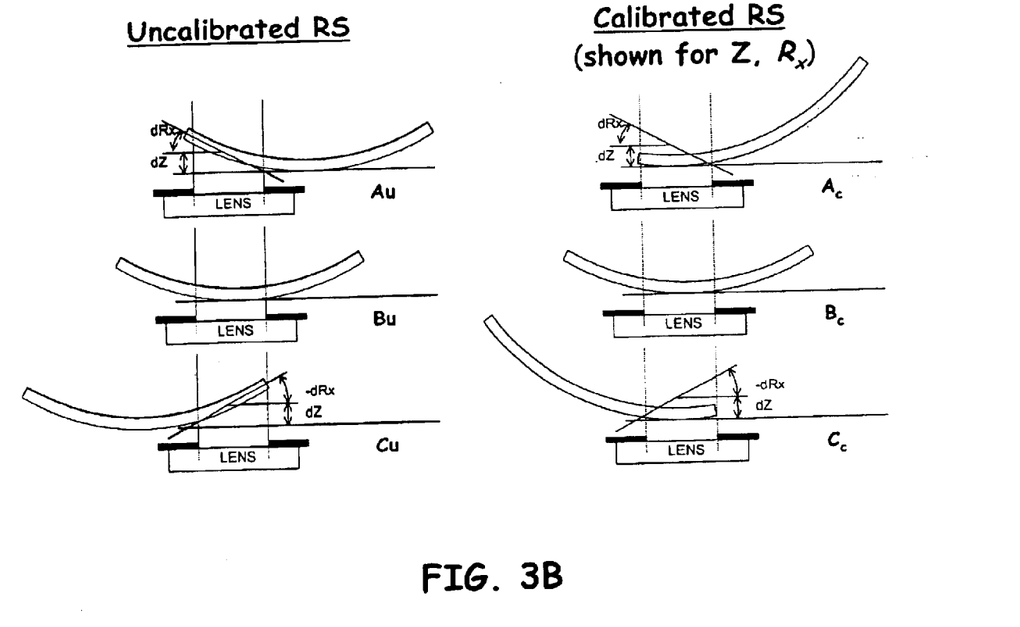

Armed with the reticle stage RS quadratic wedge distortion $Q_{rs}$, process 200 may then calibrate the reticle stage RS for quadratic distortions, as indicated in procedure task P208, and do so independently of the reticle RE. In one embodiment, the reticle stage RS is calibrated by adjusting the actuating mechanism associated with the reticle stage RS. In particular, adjustments are made to the reticle stage RS actuating mechanism so that trajectory profile of the reticle stage RS compensates for the quadratic distortions quantified by $Q_{rs}$. For example, as indicated in FIGS. 3A, 3B, the reticle stage RS actuating mechanism is adjusted to tilt the reticle stage RS in a manner that linearizes the scanning portions and, thus, minimizes the quadratic distortional effects of the reticle stage RS (e.g., calibrated RS portions: $A_c$, $B_c$, $C_c$ vs. uncalibrated RS portions: $A_u$, $B_u$, $C_u$).

As noted above, the quadratic wedge distortions (i.e., $Q_r$ and $Q_{rs}$) have the greatest effect on reticle RE and reticle stage RS unflatness and, therefore, have the greatest distortional effect. However, other deformation factors contribute to the reticle RE and reticle stage RS unflatness, such as, for example, linear reticle RE and reticle stage RS wedge distortions $W_r$, $W_{rs}$ and corkscrew (i.e., linear roll) reticle RE and reticle stage RS distortions $C_r$, $C_{rs}$. Therefore, as identified by procedure task P210, after decomposing the measured z-offset $Z_{meas}(x,y_{sl},y_{rs})$ into its constituent factors, process 200 resolves for other reticle RE and reticle stage RS contributions, such as, the linear wedge distortions $W_r$, $W_{rs}$ and corkscrew distortions $C_r$, $C_{rs}$.

Figure 4:
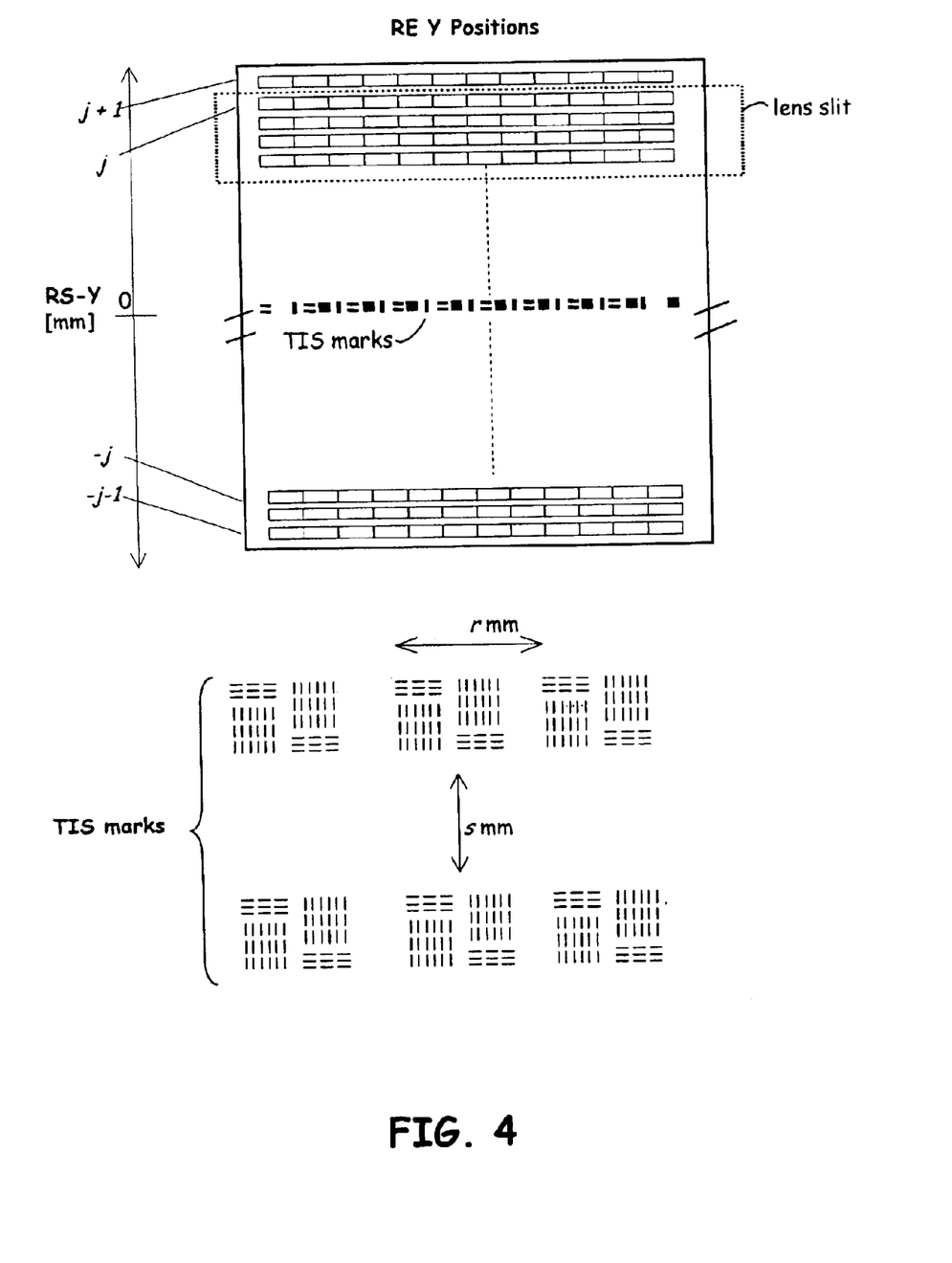
FIG. 4 illustrates a map in accordance with an embodiment of the present invention.

In one embodiment, the linear and corkscrew reticle RE and reticle stage RS distortions $W_r$, $W_{rs}$, $C_r$, $C_{rs}$, may be resolved by exposing a reticle RE having a specific TIS pattern that enables the reticle RE to be loaded in two distinct orientations (e.g., 0° and 180°) during exposure. As illustrated in FIG. 4, the patterns are configured as sets of marks that are mirror images of each other. As noted above, regarding FIG. 2B, the layout of the patterns may be provided along rows (j+1) to (−j−1) and the distance related to the periodicity of the constituent marks of the patterns are designated as r mm along the x-direction and s mm along the y-direction. With such a pattern, the reticle RE is loaded and exposed with one orientation and then the wafer substrate W is measured. The same reticle RE is subsequently rotated and exposed with a second orientation and then the wafer substrate W is measured again. By so doing, the measurements between the two orientations provide conjugate sets of height offsets that can be applied to equation (10) to resolve the reticle RE linear wedge and corkscrew distortions $W_r$, $C_r$.

Once the reticle RE linear wedge and corkscrew distortions $W_r$, $C_r$ are calculated, the reticle stage RS linear wedge and corkscrew distortions $W_{rs}$, $C_{rs}$ can then be calculated in accordance with equation (10).

Upon determining the reticle stage RS linear wedge and corkscrew distortions $W_{rs}$, $C_{rs}$, the reticle stage RS may be calibrated independently of the reticle RE, as indicated by procedure task P212, by adjusting the actuating mechanism associated with the reticle stage RS.

In this manner, the disclosed invention is capable of exploiting exposure information to determine reticle-specific deformations and then factor out to these deformations to arrive at the desired reticle stage deformations. The reticle stage RS may then be calibrated independently of the reticle RE to compensate for various reticle stage RS distortional effects.

The preceding detailed description refers to the accompanying drawings that illustrate exemplary embodiments consistent with the present invention. Other embodiments are possible and modifications may be made to the embodiments without departing from the spirit and scope of the invention. For example, the embodiments described above may, instead, be implemented in different embodiments of software, firmware, and hardware in the entities illustrated in the figures. As such, the operation and behavior of the present invention has been described with the understanding that modifications and variations of the embodiments are possible, given the level of detail present herein. Thus, the preceding detailed description is not meant or intended to limit the invention—rather the scope of the invention is defined by the appended claims.

What is claimed is:

1. A method of calibrating a reticle stage of a lithographic system, comprising:
   directing a projection beam through a reticle such that said lithographic system generates an image of said reticle;
   measuring a set of height offsets based on said reticle image;
   decomposing said set of measured height offsets into a plurality of distortional factors;
   determining reticle deformation attributes based on said distortional factors;
   determining reticle stage deformation attributes based on said distortional factors and said reticle deformation attributes; and
   calibrating said reticle stage based on said reticle stage deformation attributes.

2. The method of claim 1, wherein said image generation includes scanning, within a slit area, an identifiable marker positioned on said reticle.

3. The method of claim 1, wherein said image generation includes implementing sensors to detect vertical position focus levels.

4. The method of claim 1, wherein said distortional factors are characterized by:

$$Z_{meas}(x, y_{sl}, y_{rs}) = z_0$$
$$+ (FC_{lens} + FC_{xTIS})x^2$$
$$+ (Ry_{sl} + ry_0 + Ry_r)x +$$
$$(Rx_{sl} + rx_0 + W_r + W_{rs})y_{sl}$$
$$+ (W_r + W_{rs})y_{rs}$$
$$+ (C_{sl} + C_r)x \cdot y_{sl}$$
$$+ (C_{rs} + C_r)x \cdot y_{rs}$$
$$+ (Q_r + Q_{rs})y_{rs}^2$$
$$+ Q_r \cdot 2 \cdot y_{sl} \cdot y_{rs} + (FC_{lens} + FC_{yTIS} + Q_r)Y_{sl}^2$$

where
$Z_{means}(x, y_{sl}, y_r)$ represents the height of an identifiable marker with said reticle stage at position $y_{rs}$ and in a scan slit position x, $y_{sl}$;
$Y_{rs}$ represents the position of said reticle stage in y;
$x, y_{sl}$ represents the position of a sensor operative with said identifiable marker;
$y_r$ represents the position on said reticle in y ($y_r = y_{rs} + y_{sl}$);
$z_0$ represents the height offset of said identifiable marker, a lens, said reticle, and said reticle stage;
$FC_{lens}$, represents field curvature distortion of said lens;
$FC_{xTIS}$ represents 2nd order warp distortion of TIS plate in x;
$FC_{yTIS}$ represented order warp distortion of the TIS plate in y;
$Ry_{sl}$ represents said scan slit tilt in x of said identifiable marker,
$Ry_r$ represents the tilt offset of said reticle in x;
$ry_0$ represents the tilt offset of said reticle stage in x;
$Rx_{sl}$ represents said scan slit tilt of said identifiable marker at position $y_{rs}$;
$rx_0$ represents the tilt offset of said reticle stage at position $y_{rs}$;
$W_{sl}$ represents the wedge distortion in said scan slit;
$W_r$ represents the wedge distortion of said reticle;
$W_{rs}$ represents the wedge distortion of said reticle stage;
$Q_r$ represents the quadratic wedge distortion of said reticle;
$Q_{rs}$ represents the quadratic wedge distortion of said reticle stage;
$C_{sl}$ represents the corkscrew distortion of said scan slit;
$C_r$ represents the corkscrew distortion of said reticle; and
$C_{rs}$ represents the corkscrew distortion of said reticle stage.

5. The method of claim 1, wherein said calibrating includes adjusting an actuation mechanism associated with said reticle stage to compensate for said reticle stage deformation attributes.

6. The method of claim 1, wherein said plurality of distortional factors comprise at least one of reticle quadratic wedge distortion, reticle linear wedge distortion, reticle corkscrew distortion, reticle stage quadratic wedge distortion, reticle stage linear wedge distortion, and reticle stage corkscrew distortion.

7. The method of claim 2, where said identifiable marker includes sets of marks that are mirror images of each other and said exposing includes performing scanning measurements in two orientations.

8. The method of claim 2, wherein said image generation includes exposing said reticle on a substrate.

9. The method of claim 8, wherein said exposing includes maintaining said reticle fixed at a certain position while performing scanning measurements of said identifiable marker as said identifiable marker shifted to a plurality of predetermined positions.

10. The method of claim 8, wherein said exposing includes maintaining said reticle fixed at a certain position while performing scanning measurements as an identifiable marker is shifted to a plurality of predetermined positions.

11. A system for calibrating a reticle stage of a lithographic system, comprising:
   an exposure apparatus configured to direct a projection beam of radiation through a reticle, supported by said reticle stage, in order to generate an image of said reticle;

a measurement apparatus for measuring a set of height offsets based on said reticle image;

a processing mechanism configured to decompose said set of measured height offsets into a plurality of distortional factors, to determine reticle deformation attributes based on said distortional factors, and to determine reticle stage deformation attributes based on said distortional factors and said reticle deformation attributes; and a reticle stage actuation mechanism to control position of said reticle stage, wherein said reticle stage actuation mechanism is adjusted in calibrating said reticle stage based on said reticle stage deformation attributes.

12. The system of claim 11, wherein said exposure apparatus generates said reticle image by scanning, within a slit area, an identifiable marker positioned on said reticle.

13. The system of claim 11, wherein exposure apparatus generates said reticle image by implementing sensors to detect vertical position focus levels.

14. The system of claim 11, wherein said distortional factors are characterized by:

$$Z_{meas}(x,y_{sl},y_{rs})=z_0$$
$$+(FC_{lens}+FC_{xTIS})x^2$$
$$+(Ry_{sl}+ry_0+Ry_r)x+$$
$$(Rx_{sl}+rx_0+W_r+W_{rs})y_{sl}$$
$$+(W_r+W_{rs})y_{rs}$$
$$+(C_{sl}+C_r)x\cdot y_{sl}$$
$$+(C_{rs}+C_r)x\cdot y_{rs}$$
$$+(Q_r+Q_{rs})y_{rs}^2$$
$$+Q_r 2\cdot y_{sl}\cdot y_{rs}$$
$$+(FC_{lens}+FC_{yTIS}+Q_r)Y_{sl}^2$$

where $Z_{meas}(x,y_{sl},y_r)$ represents the height of an identifiable marker with said reticle stage at position $y_{rs}$ and in a scan slit position x, $y_{sl}$;

$Y_{rs}$ represents the position of said reticle stage in y, $x,y_{sl}$ represents the position of a sensor operative with said identifiable marker;

$y_r$ represents the position on said reticle in y ($y_r=y_{rs}+y_{sl}$);

$z_0$ represents the height offset of said identifiable marker, a lens, said reticle, and said reticle stage;

$FC_{lens}$ represents field curvature distortion of said lens;

$FC_{xTIS}$ represents 2nd order warp distortion of TIS plate in x:

$FC_{yTIS}$ represents 2nd order wary distortion of the TIS plate in v:

$Ry_{sl}$ represents said scan slit tilt in x of said identifiable marker;

$R_r$ represents the tilt offset of said reticle in x;

$ry_0$ represents the tilt offset of said reticle stage in x;

$Rx_{sl}$ represents said scan slit tilt of said identifiable marker at position $y_{rs}$;

$rx_0$ represents the tilt offset of said reticle stage at position $y_{rs}$;

$W_{sl}$ represents the wedge distortion in said scan slit;

$W_r$ represents the wedge distortion of said reticle;

$W_{rs}$ represents the wedge distortion of said reticle stage;

$Q_r$ represents the quadratic wedge distortion of said reticle;

$Q_{rs}$ represents the quadratic wedge distortion of said reticle stage;

$C_{s1}$ represents the corkscrew distortion of said scan slit;

$C_r$ represents the corkscrew distortion of said reticle; and $C_{rs}$ represents the corkscrew distortion of said reticle stage.

15. The system of claim 11, wherein said plurality of distortional factors comprise at least one of reticle quadratic wedge distortion, reticle linear wedge ew distortion, reticle stage quadratic wedge distortion, reticle on, and reticle stage corkscrew distortion.

16. The system of claim 12, where said identifiable marker includes sets of marks that are mirror images of each other and said exposing includes performing scanning measurements in two orientations.

17. The system of claim 12, wherein exposure apparatus generates said reticle image by exposing said reticle on a substrate.

18. The system of claim 17, wherein said exposing by said exposure apparatus includes maintaining said reticle fixed at a certain position while performing scanning measurements of said identifiable marker as said identifiable marker shifted to a plurality of predetermined positions.

19. The system of claim 17, wherein said exposing by said exposure apparatus includes maintaining said reticle fixed at a certain position while performing scanning measurements as an identifiable marker is shifted to a plurality of predetermined positions.

* * * * *